United States Patent
Prather et al.

[19]

[11] Patent Number: 6,136,718
[45] Date of Patent: Oct. 24, 2000

[54] METHOD FOR MANUFACTURING A SEMICONDUCTOR WAFER USING A THREADLESS CORROSION-PREVENTING GAS RING

[75] Inventors: Michael K. Prather, Buda; Rosario Louis Muto, Austin, both of Tex.

[73] Assignee: Motorola, Inc., Schaumburg, Ill.

[21] Appl. No.: 09/113,403

[22] Filed: Jul. 10, 1998

[51] Int. Cl.[7] .................................................. H01L 21/302
[52] U.S. Cl. ........................... 438/706; 438/742; 156/345
[58] Field of Search ..................... 438/706, 742; 156/345

[56] References Cited

U.S. PATENT DOCUMENTS

| | | | |
|---|---|---|---|
| 4,243,254 | 1/1981 | Hill et al. | 285/382.2 |
| 4,541,659 | 9/1985 | Nakamura | 285/382.2 |
| 5,423,942 | 6/1995 | Robbins et al. | 156/643.1 |
| 5,716,877 | 2/1998 | Yavelberg | 438/14 |
| 5,746,875 | 5/1998 | Maydan et al. | 156/345 |
| 5,792,672 | 8/1998 | Chan et al. | 438/662 |

*Primary Examiner*—William Powell
*Assistant Examiner*—Lynette T. Umez-Eronini
*Attorney, Agent, or Firm*—Keith Witek; Robert A. Rodriguez

[57] ABSTRACT

A method for manufacturing a semiconductor wafer begins by placing the wafer into a process chamber (74). A metal etch gas is then provided through a gas fitting (52) having an outlet tube (52b). The outlet tube (52b) is threadless and is made of a material which will not substantially corrode in the presence of the corrosive etch gas. In addition, the outlet tube (52b) contains gas distribution openings (84) which improve gas distribution within a gas channel (54b) of a gas ring (54). The elimination of the threading in the gas feed inlet (54a) of the gas ring (54) will allow a sidewall of the inlet (54a) to be anodized for greater corrosion protection. The reduction in corrosion will improve wafer yield, reduce manufacturing costs, and reduce equipment down time.

10 Claims, 4 Drawing Sheets

METHOD FOR MANUFACTURING A SEMICONDUCTOR WAFER USING A THREADLESS CORROSION-PREVENTING GAS RING

FIELD OF THE INVENTION

The present invention relates generally to semiconductor manufacturing, and more particularly to, using a non-corrosive non-threaded input gas ring on a metal etch system to improve wafer yield and reduce etch system corrosion.

BACKGROUND OF THE INVENTION

In the integrated circuit (IC) industry, wafer yield, manufacturing costs, and equipment up time is very important. In many cases, semiconductor fabrication equipment is designed and manufactured whereby one or more of wafer yield, manufacturing costs, or equipment maintenance is adversely affected.

As an example, plasma metal etch processing tools typically use corrosive gasses such as chlorine ($Cl_2$) and boron trichloride ($BCl_3$) to define metal features on patterned semiconductor substrates. The process gases are typically delivered from a source gas bottle to a process chamber through a stainless steel gas line. The gases are subjected to an electrical field in the chamber where they form a plasma. The plasma then reacts with the semiconductor substrate in some manner and is then evacuated from the chamber by means of a turbo, blower, and vacuum pump. Therefore, the corrosive gasses are exposed to long transportation paths that have many interfaces between different mechanical structures. The passing of corrosive gases through these interconnect points may be problematic.

Such a problematic system is illustrated in FIGS. 1–2. FIG. 1 is a side view while FIG. 2 is a cross-sectional view of the side view in FIG. 1. FIGS. 1 and 2 illustrate a metal etcher gas distribution system 10. The system 10 has two primary components, a gas fitting 12, and a gas ring 14. The gas fitting 12 has a vacuum coupling radiation laboratory (VCR) inlet thread portion 12a, a nut portion 12c for tightening the gas fitting connection to the gas ring, and a threaded outlet portion 12b. The corrosive metal etch gas is provided from a gas bottle to the portion 12a, through the portion 12c and out the outlet portion 12b. Once the corrosive gas has exited the fitting 12, the corrosive gas enters the ring 14. The gas flows around the gas channel 14b of the ring 14 and is injected into the process chamber 24 of the system 10 via chamber gas inlet holes 14c. Various o-ring regions 20 ensure that leaks are minimized in FIGS. 1–2. A ceramic top window 22 contains the gas in the process chamber and gap barrel 18 of the process chamber abuts an opposite side of the ring 14.

In FIG. 1 the ring 14 is made of aluminum which substantially corrodes when exposed to high concentrations of the metal etch corrosive gas. The exit point of the gas, which is a region directly below the outlet 12b of fitting 12 in FIGS. 1–2, is subject to high concentrations and flows of the corrosive gas. Therefore, even if the fitting is formed using a corrosion resistant material, those portions of the gas ring 14 exposed to the high concentrations of corrosive gas will still corrode at a substantially higher rate over time.

This corrosion can produce particles as well as dangerous leaks in the metal etch system 10. The particles generated by such corrosion produce several problems including "blocked etch". Blocked etch occurs when contamination/particles fall on the wafer. These particles then block the etch process from removing the underlying layer being etched. Once this etch obstruction occurs, the semiconductor wafers will experience depressed yields and potentially require scrapping. In addition, the propensity toward corrosion results in a frequent replacement of the gas rings resulting in significant downtime. Both the downtime and wafer yield loss results in increased manufacturing cost.

To prevent the disadvantageous corrosion of aluminum around the aluminum threads of region 14a, the aluminum material in the gas ring 14 is typically anodized. However, use of anodization on the threaded fittings in the region 14a of the ring 14 to prevent corrosion and excessive particle formation is not a viable alternative because the anodization process does not work well on sharp edges (e.g., threads). Additionally, because of the pitch of the threads in region 14a, anodization, when applied, is not uniformly distributed on the threads. This nonuniform distribution of the anodization results in an insufficient layer of anodization forming over portions of the threads. Therefore, even if the threads in region 14a are exposed to an anodization process, corrosive gases attack exposed areas of inadequately anodized aluminum and corrode the threads of the gas rings.

Therefore, a need exists in the IC industry for a process and apparatus that removes disadvantageous threads from the gas inlet region, enables protective anodization of a sidewall of the inlet region, reduces system corrosion, and better distributes corrosive gases within the metal etch system to improve wafer yield, reduce particle generation, reduce wafer manufacturing costs, reduce equipment downtime, reduce maintenance costs, and/or provides like benefits.

Figure 1:
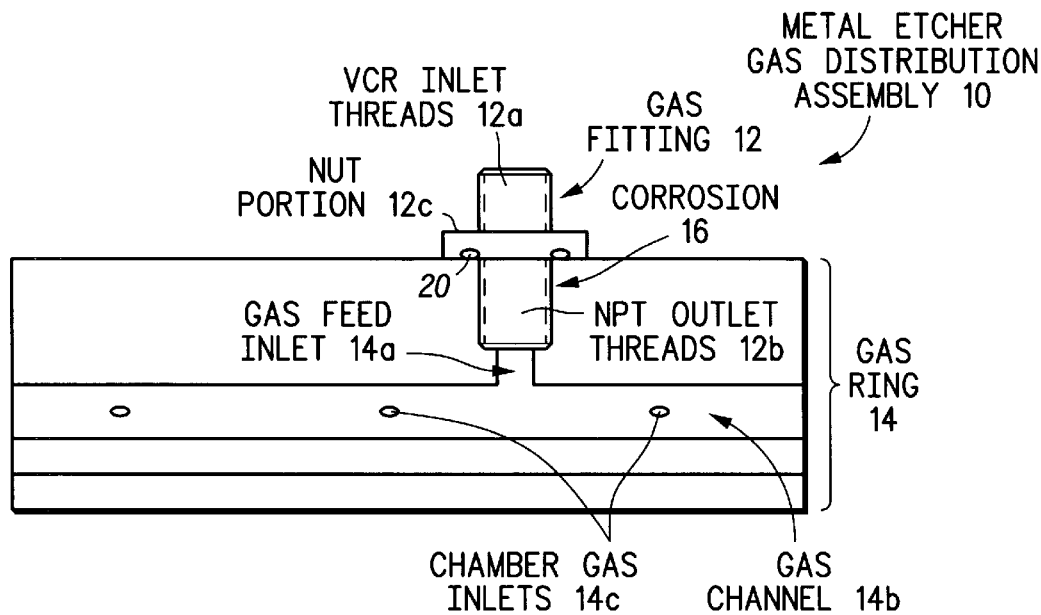
FIG. 1 illustrates, in a side view, a metal etcher gas distribution assembly that is known in the prior art.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DESCRIPTION OF A PREFERRED EMBODIMENT

Generally, the present invention is a method and apparatus for providing corrosive gas flow into a semiconductor wafer processing chamber. The apparatus used to provide the corrosive gas flow has a gas fitting where disadvantageous threading of the gas fitting and its connecting opening in the gas ring has been removed from the design. Since the threading of the gas fitting and the gas feed inlet opening in the gas ring have been removed, protective aluminum anodization of these regions is now possible. In addition, the now threadless gas feed inlet portion of the gas fitting may be made from a material that is a substantially corrosive resistant material when in the presence of the corrosive process gases.

For further process improvements, the gas feed inlet portion of the gas fitting is extended so that a bottom portion of the gas fitting is located at least partially within a gas channel of the gas ring. The portion of the gas feed inlet lying within the gas channel of the gas ring can be machined to have a closed bottom surface with gas distribution openings formed "off-center" on a sidewall of the outlet tube of the gas fitting. The presence of the sidewall-formed gas distribution openings along with the closed bottom of the outlet tube improves gas flow distribution into the gas channel whereby various advantages are obtained. Specifically, the method and apparatus taught herein will allow for one or more of: (1) removal of disadvantageous threads from the design of FIGS. 1–2; (2) protective anodization of inlet portions of the gas ring; (3) reduction of system corrosion; (3) improved distribution of corrosive gases in the system; (4) reduced particle generation in the etch system; (5) reduced manufacturing costs; (6) improved wafer yield; (7) reduced equipment down time; (8) reduced maintenance costs and part replacement costs, and/or like benefits.

The invention can be further understood with reference to FIGS. 3 through 8 hereinbelow.

Figure 2:
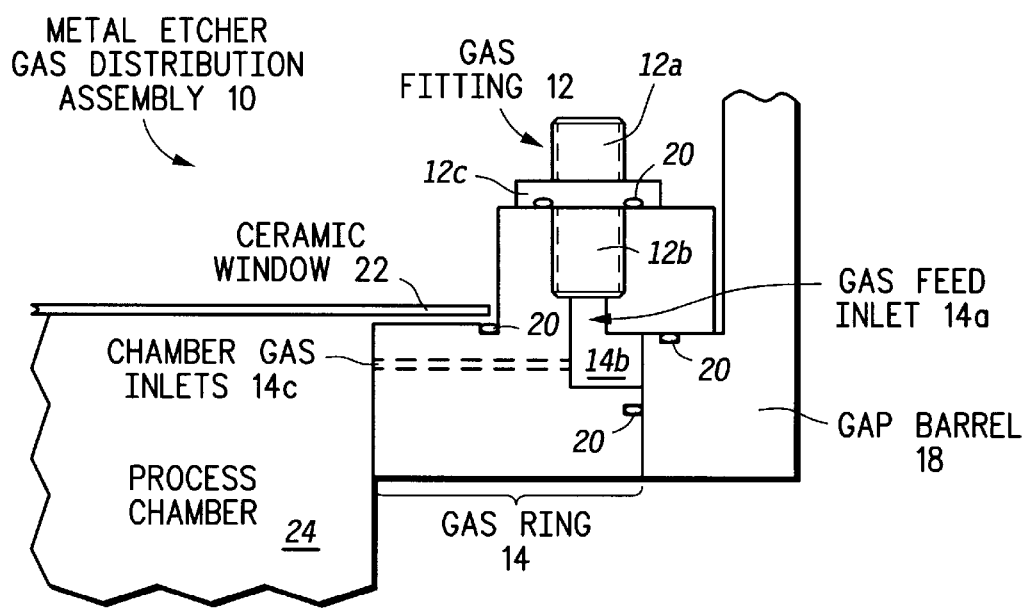
FIG. 2 illustrates, in a cross-sectional diagram, the metal etcher gas distribution assembly of FIG. 1 as it is known in the prior art.
Figure 3:
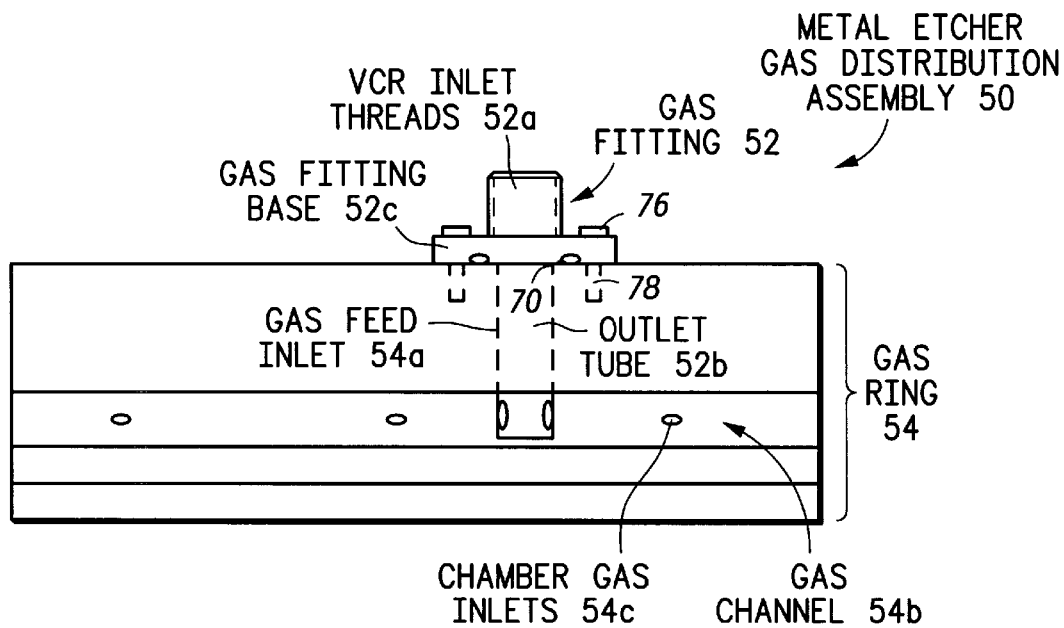
FIG. 3 illustrates, in a side view, a metal etcher gas distribution assembly in accordance with the present invention.
Figure 4:
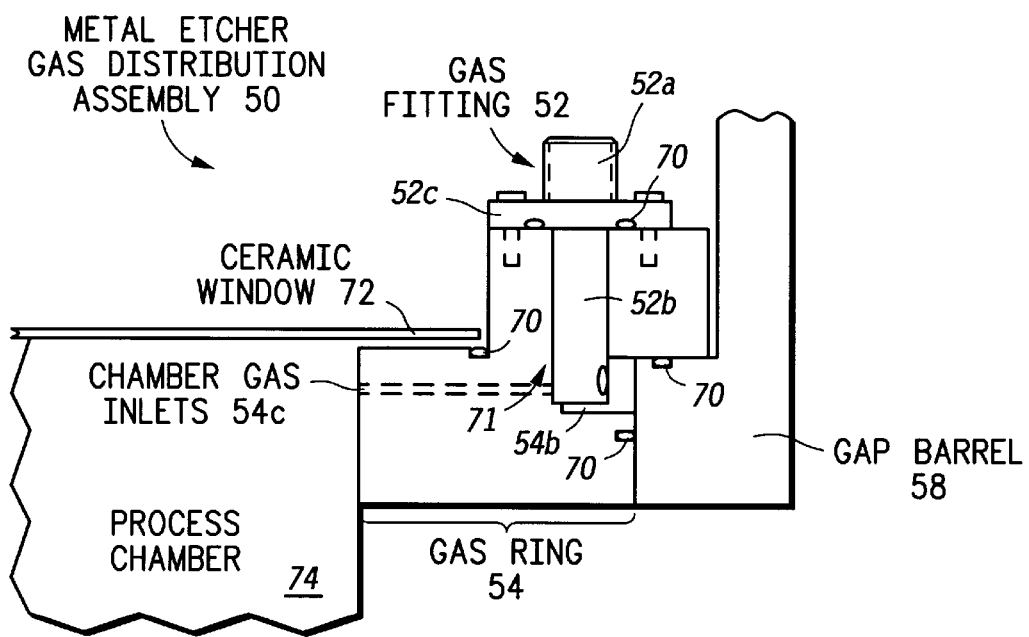
FIG. 4 illustrates, in a cross-sectional diagram, the metal etcher gas distribution assembly of FIG. 3 in accordance with the present invention.

FIGS. 3 and 4 illustrate a metal etcher gas distribution assembly 50 which may be used in lieu of the prior art metal etcher gas distribution assembly 10 of FIGS. 1 and 2. Specifically, FIGS. 3 and 4 illustrate a portion of a metal etch system, such as the Lam 9600 etch system. It is important to note that the apparatus and methodology discussed herein may be used for any oxide etcher, any nitride etcher, any polysilicon etcher, any plasma etch or deposition system, batch system, single wafer system, or any like semiconductor fabrication equipment which transports corrosive gases. Specifically, FIG. 3 illustrates a side view of the metal etch gas distribution assembly 50 while FIG. 4 illustrates a cross-sectional view of the assembly 50 of FIG. 3.

The assembly 50 of FIGS. 3 and 4 contains two primary sub-elements. FIGS. 3 and 4 contain a gas fitting 52 which is coupled to a gas ring 54. The gas fitting 52 is mechanically connected to the gas ring 54 through the use of screws 76 as shown in FIGS. 3 and 4. The screws are placed through openings in the gas fitting 52 and into threaded openings of the gas ring 54 in order to allow the gas fitting 52 to be mechanically secured to the gas ring 54 in FIGS. 3–4. In addition, leaks within the system 50 are reduced by using various o-ring seals 70 illustrated in FIGS. 3 and 4. The o-ring seals 70 also allow various portions of the system to be protected from adverse interaction with the fabrication facility ambient.

The gas fitting 52 contains three primary sub-portions. A first sub-portion of the gas fitting 52 is a vacuum coupling radiation laboratory (VCR) inlet thread portion 52a. The VCR inlet thread portion 52a uses compression fitting to connect the gas fitting 52 to a stainless steel corrosive gas line (not shown in FIGS. 3–4). The stainless steel corrosive gas line (not specifically illustrated in FIG. 3 or 4) connects at an opposite end to mass flow controllers (MFCs), computer(s), valves, regulators, additional gas piping, and gas bottles/sources (none shown specifically in FIGS. 3–4) in order to provide one or more corrosive gases and/or inert carrier gases to the gas fitting 52.

The VCR inlet thread portion 52a is connected to a gas fitting base portion 52c illustrated in FIGS. 3 and 4 which is the second sub-portion of the gas fitting 52. The gas fitting base portion 52c has at least two openings through which are placed the screws 76. In addition, the fitting base portion 52c has structures that allows for the formation of the o-ring seal 70 illustrated in FIG. 3.

The third primary sub-portion of the gas fitting 52 is illustrated as the outlet tube 52b in FIGS. 3 and 4. The outlet tube 52b may be configured in many different manners, two of which are specifically illustrated separately in FIGS. 5 and 6. In FIGS. 3 and 4, a top portion of the outlet tube 52b is connected to a bottom portion of the gas fitting base 52c. Corrosive processing gases and/or other gases flow from the VCR inlet thread 52a through the gas fitting base 52c and through the outlet tube 52b during semiconductor processing and chamber preparation or cleaning operations. A bottom portion of the outlet tube 52b contains one or more openings either on a bottom portion and/or on a sidewall portion of the outlet tube 52b to distribute the corrosive gases in several directions within a gas ring 54.

Generally, the gas fitting 52 illustrated in FIGS. 3 and 4 as containing portions 52a through 52c is made from a stainless steel material and machined together from one contiguous piece of steel. Therefore, which sub-portions 52a–52c above are being referred to as being connected or coupled together, such connection may be inherent in a starting piece of single steel or subsequently created by welding or a like connection operation. Stainless steel is a preferred material for the fitting 52 in the apparatus of FIGS. 3 and 4 since the gas fitting 52 will typically interface to a stainless steel interconnect. In addition, stainless steel is relatively non-corrosive in metal etch systems which use chlorine ($Cl_2$) or boron trichloride ($BCl_3$) (or a like halogen). In addition to the portions 52a through 52c in FIGS. 3 and 4 being made of stainless steel, one or more of these portions may be made of Teflon®, Vespel®, ceramic, and/or quartz, or combinations thereof. Each sub-portion and parts thereof may be the same material or different materials. Generally, it is important that the outlet tube 52b be made of some material which is completely resistant or substantially resistant to some acceptable level to corrosion when in the presence of any corrosive process gas that flows through the gas fitting 52.

FIG. 3 illustrates that the gas fitting 52 interfaces with a gas ring 54. In the embodiment of FIGS. 3 and 4 the gas ring 54 is made from an aluminum material that is preferably anodized. However, the gas ring 54 may be made of other materials or composites of several material such as ceramic, stainless steel, or the like. The gas ring 54 is machined with an opening that is referred to as a gas feed inlet 54a in FIG. 3. Unlike the prior art FIGS. 1 and 2, the gas feed inlet opening 54a does not need any threading whatsoever. Since the inlet 54a is not threaded at all in FIGS. 3 and 4, the outlet tube/sleeve 52b in the gas fitting 52 is also not in need of any threading. Since the gas feed inlet opening 54a contains no threads, a side wall surface of the gas feed inlet opening 54a may be readily anodized for corrosion protection unlike the prior art apparatus of FIGS. 1 and 2 that contains threads. The opening 54a in the ring 54 in FIG. 3 opens into a cylindrical gas channel 54b contained within a circumference of the gas ring 54. The corrosive processing gases are provided through the gas fitting 52 and into the gas channel 54b where the gas channel 54b will distribute the corrosive processing gas around the circumference of the gas ring 54 within the channel 54b. The corrosive gas that is distributed around the gas ring 54 is provided through one or more chamber gas inlets 54c to a process chamber 74 illustrated in FIG. 4.

In FIGS. 3 and 4 a bottom portion of the outlet tube 52b extends into a portion of the gas channel 54b unlike the prior art structure of FIGS. 1–2. In order to provide a proper interface between the gas fitting 52 and the gas channel 54b, a vertical-oriented side wall portion of the gas channel 54b needs to be machined to form a grove 71. The outlet tube 52b will lie at least partially within a portion of the grove 71. FIG. 4 also illustrates a ceramic top window 72 which helps to contain corrosive processing gases and the plasma within the processor chamber. An outside circumference of the gas ring 54 is mechanically fastened to a gap barrel 58 as illustrated in FIG. 4.

Figure 5:
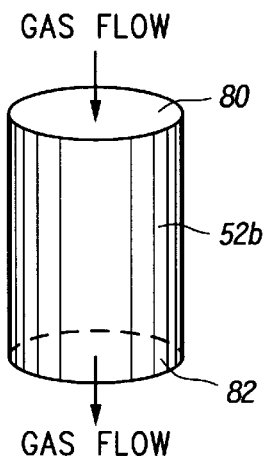
FIG. 5 illustrates, in a three-dimensional perspective view, a magnified view of one possible outlet tube used within the gas fitting in FIGS. 3 and 4 in accordance with the present invention.
Figure 6:
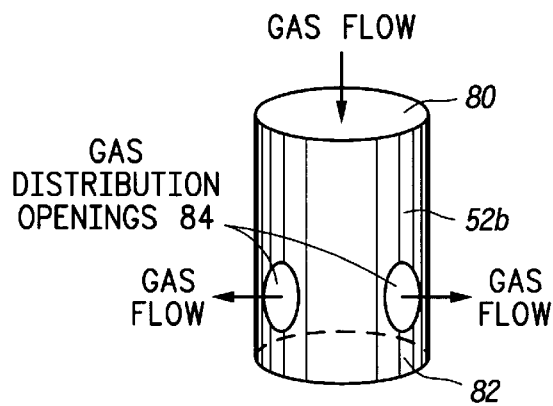
FIG. 6 illustrates, in a three dimensional perspective view, an alternate outlet tube that may be used within the gas fitting of FIGS. 3 and 4 in accordance with the present invention.

FIGS. 5 and 6 illustrate two different embodiments of the outlet tube 52b in FIGS. 3 and 4. FIG. 5 illustrates one embodiment of the outlet tube 52b while FIG. 6 illustrates the other embodiment. In FIGS. 5–6, the outlet tube 52b is preferably made of stainless steel as previously discussed and has a first end and a second end.

In FIG. 5, at the first end of the tube 52b, an opening 80 is present where the opening 80 is connected to the gas fitting base 52c in FIGS. 3 and 4. As can be seen in FIG. 5, the opening 80 accepts an input corrosive gas flow from the regions 52a and 52c of the gas fitting 52 in FIGS. 3 and 4. The corrosive gas flow is then transferred along a length of the outlet tube 52b to a second end of the tube 52b. At the second end of the tube 52b is another opening 82. The opening 82, at a bottom portion of the outlet tube 52b, will provide a corrosive gas output to the gas channel 54b illustrated in FIGS. 3 and 4.

While the outlet tube 54b illustrated in FIG. 5 may be used in semiconductor processing with improved results over that associated with FIGS. 1–2, the providing of gas flow directly onto a bottom surface of the gas channel 54b may not always be advantageous. In some circumstances, the gas ring 54 may be made of materials that may be corroded over time in the presence of the corrosive gas. In these circumstances, directing a large quantity of corrosive gas at a high flow rate directly against a localized bottom surface of the channel 54b directly under the outlet tube 52b may not be advantageous. In these cases, the structure of FIG. 6 may be utilized in lieu of the structure illustrated in FIG. 5.

FIG. 6 illustrates a second embodiment which may be used for the outlet tube 52b in FIGS. 3 and 4. An opening 80 is present at the top end of the tube 52b in FIG. 6 as in FIG. 5. This opening 80 interfaces to the gas fitting base 52c of FIGS. 3 and 4 to accept a corrosive gas input flow as shown in FIG. 6. The corrosive gas input flow in FIG. 6 is transferred along a length of the outlet tube 52b to a bottom portion of the outlet tube 52b. At the bottom of the tube 52b is a closed bottom portion 86. In other words, the structure of FIG. 6 is different from FIG. 5 in that FIG. 5 had an open bottom portion 82, whereas FIG. 6 has a closed bottom portion 86. On a bottom side wall portion of the tube 52b, one or more gas distribution openings 84 are formed. Preferably, two gas distribution openings 84 are formed on roughly opposite sides of the tube 52b so that gas is distributed evenly down both directions of the gas channel 54b. In a preferred form, the gas distribution openings 84 are formed slightly off center and to one side of the tube 52b. This slightly offset center formation of the gas distribution openings 84 is needed in some designed to ensure that the gas output flow from these openings 84 is centrally located within the gas channel 54 (i.e., in some cases, the outlet tube 54a will not be positioned directly in the center of the channel 54b as shown in FIG. 4).

Figure 7:
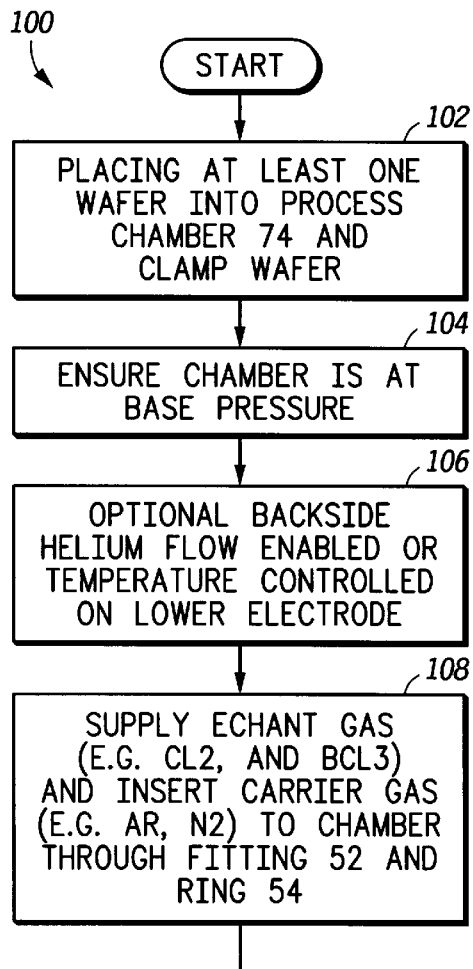
FIG. 7 illustrates, in a flow chart, a method for manufacturing a semiconductor wafer using the structures of FIGS. 3 through 6 in accordance with the present invention.

FIG. 7 illustrates a method 100 for processing one or more semiconductor wafers using the structures illustrated in FIGS. 3 through 6. The method 100 begins by performing a step 102. In step 102, at least one semiconductor wafer is placed into the process chamber 74 of FIGS. 3 through 4 and the wafer is typically clamped to a chuck (not specifically shown in the figures) within the chamber 74. The wafer can be clamped to the chuck within chamber 24 by electrostatic force, a mechanical clamping mechanism, a vacuum, or another clamping methodology, or the wafer may, in some embodiments, remain unclamped and free standing on the wafer chuck. The system illustrated in FIGS. 3 through 6 may be a system that accommodates multiple wafers for batch processing or may be a single wafer system. The process chambers 74 may be only one chamber in a multichamber system (e.g., a cluster tool) or the chamber 74 may be the only chamber in the semiconductor fabrication equipment. Preferably, the movement of the wafer is performed by robotic arms under computer control, however, other mechanisms for moving wafers can be utilized. The wafer is preferably a semiconductive wafer of any diameter that is made of one or more of silicon, silicon on insulator (SOI) material, germanium, gallium arsenide, silicon carbide, and/or like materials.

After step 102 is completed in FIG. 7, a step 104 is performed. In step 104, vacuum pumps, blowers, and/or turbomolecular pumps are used to evacuate the chamber to a base pressure. In some situations, the processing chamber is connected to a load lock where the chamber 74 is already at or near a base pressure before wafer insertion. In these cases, sensors on the system simply ensure that the base pressure within the chamber 74 is a correct starting pressure without a need for significant pump-down of the chamber.

After ensuring a proper base pressure in step 104, a step 106 is performed. In step 106, one of two optional operations can be performed. In one form, back side helium flow may be provided through the wafer chuck in order to assist in temperature control of the wafer. In another form, a thermal temperature of a lower electrode in the process chamber 74 may be controlled to ensure a proper processing temperature of the semiconductor wafer.

After step 106, a step 108 is performed. In step 108, the structures of FIG. 3 through 6 are used to provide one or more process gases to the chamber 74 through the gas fitting 52 and the gas ring 54. In a metal etch process, the corrosive process gas provided by the fitting 52 and the gas ring 54 is typically one or more of chlorine and boron trichloride. In addition to these corrosive metal etch gases, an inert carrier gas may be provided through the gas fitting 52 and the gas ring 54 to the process chamber 74. Such inert carrier gases include one or more of argon (Ar), nitrogen ($N_2$), and like inert or noble gases. As previously mentioned, the use of the gas fitting 52 and the gas ring 54 will ensure that reduced particle count results within the assembly 50 whereby wafer yield is improved, cost of manufacturing is reduced, and equipment down time is minimized.

After step 108 is performed, a step 110 is performed. Due to the addition of various gas flows to the chamber in step 108, step 110 is utilized to ensure that a pressure within the chamber 74 is maintained within a proper processing threshold. In step 110, various vacuum pumps, blowers, and/or turbomolecular pumps are utilized to maintain a proper pressure set point within the chamber 74. In addition, the positioning of throttle valves may be adjusted in step 110 in order to maintain the set point pressure.

After a set point process pressure is obtained in step 110, radio frequency (RF) power is provided to the chamber 74 in step 112. The RF power provided in step 112 will convert the process gases supplied to the chamber in step 108 into an energized plasma.

After the plasma is formed in step 112, either a timed etch or an optical endpoint etch process is performed on the semiconductor wafer located within the chamber 74. In other words, the plasma created from the etchant gas via steps 108, 110, and 112 is exposed to the wafer for a certain amount of time in order to etch portions of a metallic material from the surface of the wafer. In other forms, the plasma may be used to surface clean the wafer, deposit a layer of material over a top surface of the wafer, or perform other semiconductor wafer operations requiring corrosive gas flow. After the timed etch terminates or the endpoint time is reached in step 114, the RF power and gas flow through the structures 52 and 54 of FIGS. 3 through 4 is terminated in a step 116.

In the case of a system that has an exit load lock, a step 118 is used to return the chamber to base pressure in order to allow for efficient transfer of the wafer to the exit load lock. In other embodiments, the step 118 may need to return the pressure in the chamber to atmospheric or near-atmospheric pressure to allow the wafer to be removed to the atmosphere. In either instance, the step 118 will adjust or monitor pressure to ensure that the chamber is at a proper post-wafer-processing pressure. After completion of step 118, the wafer is removed from the chamber 74 via a step 120 in FIG. 7.

Due to the presence of the gas fitting 52 and its subcomponents as illustrated in FIGS. 3 through 6, erosion of the gas ring 54 is reduced, particle counts and "blocked etch" on the wafer is reduced, manufacturing costs are improved, and equipment down time is minimized when using the process of FIG. 7.

Figure 8:
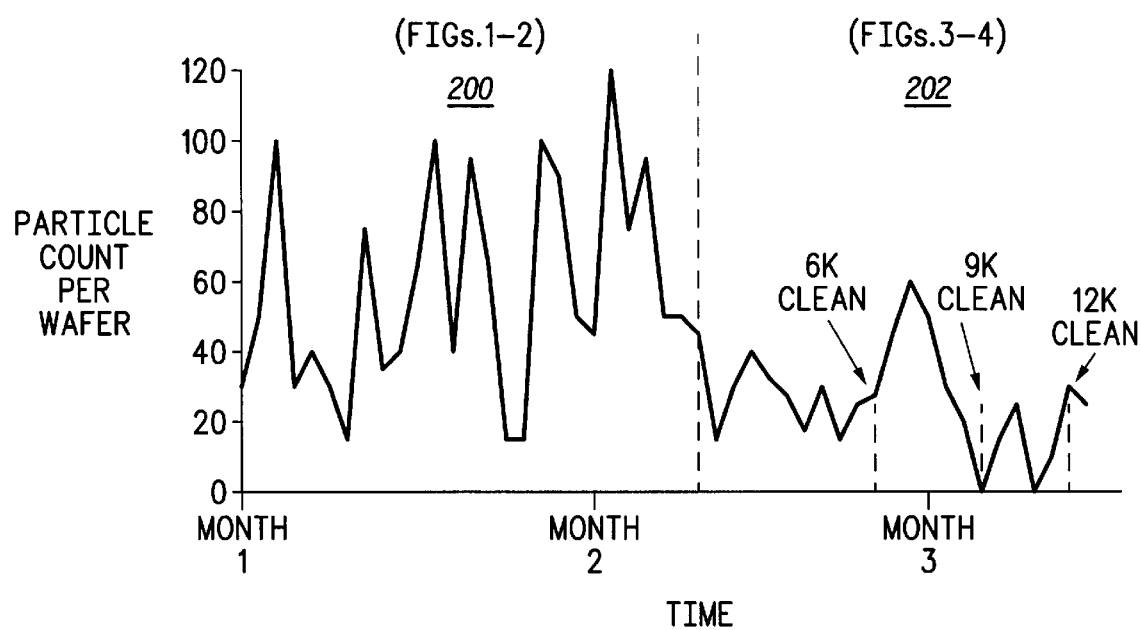
FIG. 8 illustrates, in an X–Y plot, particle data for the prior art system of FIGS. 1 and 2 as compared to the particle data for the improved system of FIGS. 3 through 6 in accordance with the present invention.

FIG. 8 illustrates an X–Y plot of particle data taken to compare the operation of the prior art apparatus of FIGS. 1 and 2 to the improved apparatus of FIGS. 3 through 6 herein. FIG. 8 has a vertical X axis that indicates particle count information. Specifically, the X axis indicates the number of particles detected per processed wafer wherein a particle will register as a count when the particle has a diameter in any direction greater than at least 0.3 micron. The Y horizontal axis of FIG. 8 represents time. Roughly a period of three months worth of data is plotted in FIG. 8 as illustrated.

FIG. 8 is split into a first portion of data 200 and a second portion of data 202. The particle data illustrated within the region 200 is particle data detected when using the prior art system of FIGS. 1 through 2. As can be seen in portion 200 of FIG. 8, the average particle count per wafer when using the prior art structure of FIGS. 1 and 2 is roughly 70 particles per wafer. After collecting several months of data using the prior art apparatus of FIGS. 1 and 2, the same processing tool was converted from the apparatus of FIGS. 1 and 2 to the apparatus of FIGS. 3 through 6. Particle data was then collected for this new apparatus illustrated in FIGS. 3 through 6 herein using the same detection equipment. The particle data collected for the apparatus of FIGS. 3–6 is illustrated in right-hand portion 202 of FIG. 8. As can be seen in FIG. 8, it was found that an average particle count of roughly 30 particles per wafer was detected when using the improved structure and process of FIGS. 3–7. In other words, a 2x (or more) reduction in particle count affecting the wafer was found when the apparatus of FIGS. 3 through 6 was utilized instead of the structure of FIGS. 1–2. In addition, hundreds of thousands of dollars in gas ring replacement were saved, and down-time losses were significantly reduced.

As illustrated in FIG. 8, the reduced particle count associated with the apparatus of FIGS. 3 through 6 was maintained even after 12000 wafers were processed by the system. Cleans were performed at the 6000 wafer mark, the 9000 wafer mark, and the 12000 wafer mark as shown in FIG. 8 which is conventional in the art. It is believed that the new structure of FIGS. 3–6 and the process of FIG. 7 will allow 8000 or more wafers to be run between cleans, which is advantageous. Therefore, FIG. 8 clearly illustrates that reduced "block etch" will occur when using the apparatus of FIGS. 3 through 6 whereby wafer yield will be improved and costs significantly reduced.

Although the invention has been described and illustrated with reference to specific embodiments, it is not intended that the invention be limited to those illustrative embodiments. Those skilled in the art will recognize that modifications and variations may be made without departing from the spirit and scope of the invention. Therefore, it is intended that this invention encompasses all the variations and modifications as fall within the scope of the appended claims.

What is claimed is:

1. A method for manufacturing a semiconductor wafer, the method comprising the steps of:

depositing a metallic layer onto the semiconductor wafer;

placing the semiconductor wafer into a processing chamber;

passing a metal etch process gas comprising chlorine atoms through a gas fitting, the gas fitting comprising:
  a gas inlet portion coupled to receive the metal etch process gas as an input to the gas fitting;
  a base fitting coupled to the gas inlet portion;
  a threadless gas outlet coupled to the base fitting, the threadless gas outlet having a first end having a first opening coupled to the base fitting and a second end having a second opening for providing a process gas as an output; and
  wherein portions of the gas fitting are made of a corrosion-resistant material that is substantially resistive to corrosion when exposed to the metal etch process gas;

passing the metal etch process gas from the threadless gas outlet of the gas fitting into a gas ring, the gas ring being mechanically fastened to the gas fitting at least two separated points, the gas ring comprising:
  a gas feed inlet opening in which is positioned the threadless gas outlet;
  a gas channel coupled to the gas feed inlet wherein the second opening of the threadless gas outlet lies at least partially within the gas channel;
  at least one opening in the gas channel to provide the process gas to a process chamber containing the semiconductor wafer; and
  wherein a portion of the gas ring is made of material that is more corrosive in a presence of the process gas than the corrosion-resistant material of the gas fitting, the gas fitting protecting a portion of the gas ring from corrosion when the gas ring is in the presence of the process gas;

etching at least a portion of the metallic layer from the semiconductor wafer within the process chamber using the process gas; and removing the semiconductor wafer from the processing chamber.

2. The method of claim 1, wherein the second opening of the threadless gas outlet includes at least two gas distribution openings formed on a sidewall of the second end of the threadless gas outlet where the second end of the threadless gas outlet that is opposite the first opening is closed.

3. The method of claim 2 wherein the at least two gas distribution openings are located off-center of a central diameter of the sidewall of the threadless gas outlet.

4. The method of claim 1 wherein a groove is formed perpendicular to a direction of gas flow through the gas channel and where the threadless gas outlet is positioned at least partially within the groove.

5. The method of claim 1 wherein screws couple the gas fitting to a gas ring in two separated points and where the screws are placed through openings in both the base fitting and the gas ring.

6. The method of claim 1 wherein gas feed inlet has a surface that is made of anodized aluminum.

7. A method for manufacturing a semiconductor wafer, the method comprising the steps of:

placing the semiconductor wafer in a processing chamber, the semiconductor wafer having a surface;

flowing a process gas through a gas fitting comprising a threadless gas outlet, the threadless gas outlet having two openings formed on a sidewall of the threadless gas outlet to provide the process gas to the processing chamber, wherein the two openings are located on opposite sides of the sidewall of the threadless gas outlet, and wherein an end portion of the threadless gas outlet is closed;

altering the surface of the semiconductor wafer using the process gas wherein the threadless gas outlet includes a material that is substantially resistive to corrosion in a presence of the process gas; and processing the semiconductor wafer to form a semiconductor structure.

8. The method of claim 7, wherein the processing chamber is a metal etch processing chamber.

9. The method of claim 7, wherein the process gas comprises halogens.

10. The method of claim 7, wherein the gas fitting includes a material selected from a group consisting of: stainless steel, Teflon®, ceramic, Vespel®, quartz, and aluminum.

* * * * *